United States Patent [19]

Matsuoka

[11] Patent Number: 4,855,775
[45] Date of Patent: Aug. 8, 1989

[54] DEVELOPING APPARATUS

[75] Inventor: Fuminori Matsuoka, Kofu, Japan

[73] Assignee: Tokyo Electron Limited, Tokyo, Japan

[21] Appl. No.: 184,806

[22] Filed: Apr. 22, 1988

[30] Foreign Application Priority Data

Apr. 28, 1987 [JP] Japan .................. 62-106126

[51] Int. Cl.⁴ .............................. G03D 3/02
[52] U.S. Cl. ................... 354/325; 354/320; 134/153; 134/198
[58] Field of Search ............... 354/316, 317, 320, 323, 354/324, 325, 329, 330; 134/151, 153, 198, 199, 200; 156/345

[56] References Cited

U.S. PATENT DOCUMENTS

| | | | |
|---|---|---|---|
| 4,161,356 | 7/1979 | Griffen et al. | 354/325 |
| 4,429,983 | 2/1984 | Cortellino et al. | 354/330 |
| 4,519,846 | 5/1985 | Aigo | 134/199 |
| 4,557,785 | 10/1985 | Ohkuma | 134/198 X |
| 4,682,615 | 7/1987 | Burkman et al. | 134/198 |
| 4,745,422 | 5/1988 | Matsuoko et al. | 354/330 |
| 4,753,258 | 6/1988 | Seiichiro | 134/198 |
| 4,755,844 | 7/1988 | Tsuchiya et al. | 354/325 |
| 4,788,994 | 12/1988 | Shinbara | 134/153 X |

FOREIGN PATENT DOCUMENTS 56-55047  5/1981  Japan .
57-45232  3/1982  Japan .

*Primary Examiner*—A. A. Mathews
*Attorney, Agent, or Firm*—Oblon, Spivak, McClelland, Maier & Neustadt

[57] ABSTRACT

In a developing apparatus according to the present invention, a supply path of a developing solution is formed in a cup member which constitutes a dip tank of the developing solution so that the spraying pressure of the developing solution is not directly applied to an object to be processed. As a result, uniform, high-quality images can be developed on an entire area of the object.

8 Claims, 4 Drawing Sheets

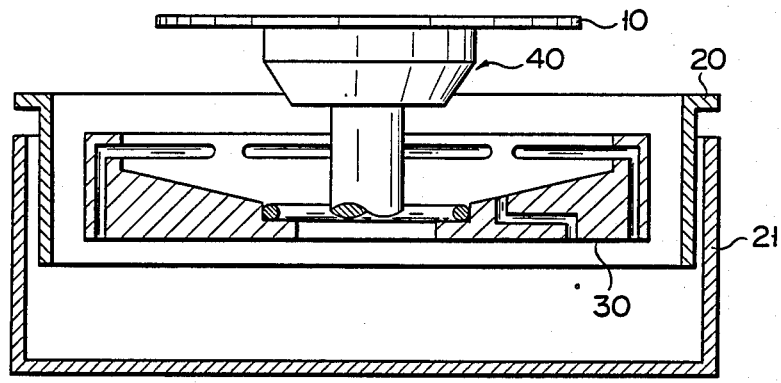
F I G. 3A
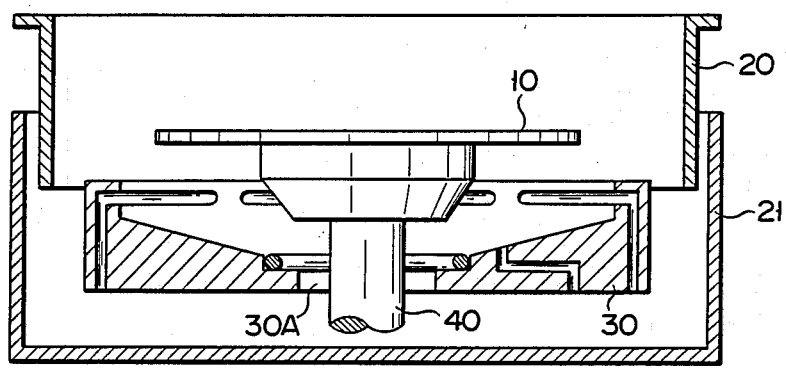
F I G. 3B
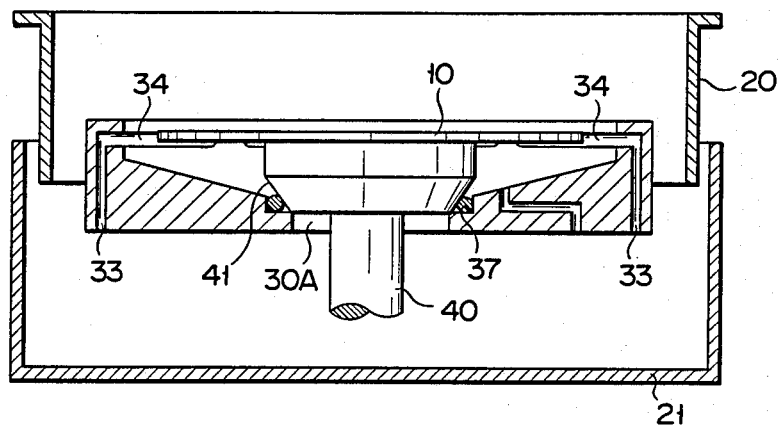
F I G. 3C

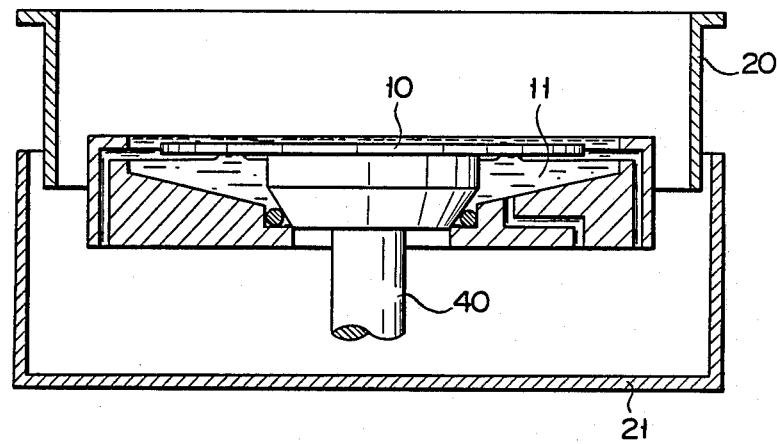
F I G. 3D
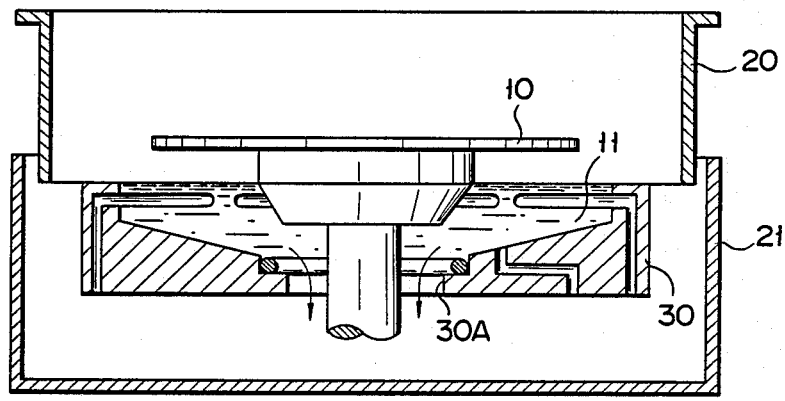
F I G. 3E

DEVELOPING APPARATUS

BACKGROUND OF THE INVENTION

1. Field of the Invention

The present invention relates to a developing apparatus used for so-called dip development for semiconductor wafers or the like.

2. Description of the Prior Art

One of the steps in fabricating semiconductor devices is a developing process of a resist film deposited on a surface of a semiconductor wafer (to be simply referred to as a wafer hereinafter).

Such developing apparatuses can be categorized into two types, i.e., one using a system of developing a plurality of wafers in a batch processing manner, and the other using a so-called continuous processing system. In the continuous processing system, wafers are sequentially conveyed one by one to the developing apparatus. For an automatic developing process, the type using the continuous processing system is advantageous over the one using the batch processing system.

The following two types have been mainly used as conventional developing apparatuses using the continuous processing system. One is a type using a spray system in which a developing solution is sprayed on a wafer. The other is a type using a paddle system in which development is performed by forming a paddle of developing solution on a wafer using a surface tension.

Demands have been recently arisen for high integration density of semiconductor devices. For this purpose, when a resist film is developed, an improvement in process precision is required, and a so-called aspect ratio (a ratio of the width of a pattern to which development can be performed to the depth of the pattern to which development can be performed) needs to be improved, as in dry etching after a developing ,process.

In order to meet such requirements, resist makers recommend using a developing solution containing an activator such as a penetrating agent and a surface protective agent. The solution containing the activator is very effective improving the aspect ratio. However, in some developing systems, if the developing solution containing the activator is used, uniform quality of resist films may not be obtained.

For example, in the developing apparatus of the spray system, a protective agent is precipitated on a portion where a high pressure is generated because of variations in spraying pressure of a developing solution on a wafer. As a result, dissolution delay locally occurs and a nondeveloped portion is locally formed.

On the other hand, in the developing apparatus of the paddle system, a paddle may not sufficiently formed because of a decrease in surface tension of the developing solution containing the activator.

Accordingly, especially in the case wherein development is performed using the developing solution containing the activator, the developing apparatus of the dip system is more effective, wherein a wafer is dipped in the developing solution.

FIG. 1 shows a developing apparatus of the continuous processing system using the dip system. Reference numeral 1 denotes an upper cup. Upper cup 1 is fitted in lower cup 2 to prevent scattering of a developing solution. Inner cup 3 is arranged in upper cup 1. Recess 3A is formed in inner cup 3 to define a dip tank for developing solution 11. An opening portion is formed at a central portion of inner and lower cups 3 and 2 to assure a path for allowing the vertical movement of spin chuck 7. In addition, residue drain pipe 4 communicating with recess 3A and wafer sealing vacuum pipes 5 are arranged in inner cup 3. Wafer sealing packings 6 are respectively arranged on end portions of vacuum pipes 5 so as to face recess 3A, thereby extending from a lower surface of recess 3A.

In the developing apparatus arranged in this manner, wafer 10 is held by suction on wafer sealing packings 6 by the effect of wafer sealing vacuum pipes 5. Upon suction of wafer 10, developing solution 11 is stored in recess 3A without leakage. More specifically, when development is to be performed, developing solution 11 is supplied to recess 3A in inner cup 3 through a nozzle or the like (not shown) arranged above wafer 10.

However, in such a developing apparatus, in order to form a dip tank for developing solution 11, developing solution 11 must be sprayed above wafer 10. As a result, since the spraying pressure of developing solution 11 is applied to wafer 10, defective development due to the spraying pressure cannot be prevented.

SUMMARY OF THE INVENTION

It is an object of the present invention to provide a developing apparatus which has a simple structure and ca develop a high-quality image on an entire area of an object to be processed by decreasing a developing solution spraying pressure acting on the object.

More specifically, a developing apparatus according to the present invention, in which an object to be processed is arranged in a cup member constituting a dip tank of a developing solution and the developing solution is supplied to the cup member to perform dip development while the object is dipped in the developing solution, is characterized in that a supply path for supplying the developing solution into the cup member is formed in the cup member itself.

The developing apparatus according to the present invention is especially effective when a resist film deposited on a surface of a semiconductor wafer is subjected to dip development.

The supply path for the developing solution is preferably arranged by burying a developing solution supply pipe in the cup member while forming its spraying port in an inner circumferential wall. A plurality of spraying ports ar preferably formed in the inner circumferential wall at predetermined angular intervals as to supply a uniform amount of developing solution toward a central portion of the cup member. A supply port of the developing solution supply pipe is preferably formed to be exposed in a bottom portion of the cup member.

The cup member may be constituted by inner and lower cups to be fitted to each other.

The spraying ports of the supply path of the developing solution may be formed on a bottom side of the cup member from the object arranged in the cup member.

Part of the dip tank of the developing solution may be formed by part of the object.

In the developing apparatus arranged in this manner, the supply path of the developing solution is formed in the cup member itself. For this reason, the developing solution is supplied into the cup member along its inner circumferential wall or its inner lower surface side. Therefore, compared with the conventional case wherein the developing solution is sprayed above the object to be processed, the spraying pressure of the developing solution against the object is decreased to a very small value or to zero. As a result, even when the developing solution contains an activator, defective development due to spraying pressure can be prevented, and uniform, high-quality images can be developed on the entire area of the object.

Various other objects, features and attendant advantages of the present invention will be more fully appreciated as the same becomes better understood from the following detailed description when considered in connection with the accompanying drawings in which like references characters designated like or corresponding parts throughout the several views and wherein:

BRIEF DESCRIPTION OF THE DRAWINGS

FIGS. 3A to 3E are views for explaining an operation of the apparatus according to the embodiment in FIG. 2.

DESCRIPTION OF THE PREFERRED EMBODIMENT

An embodiment of the present invention will be described with reference to the accompanying drawings.

Figure 2:
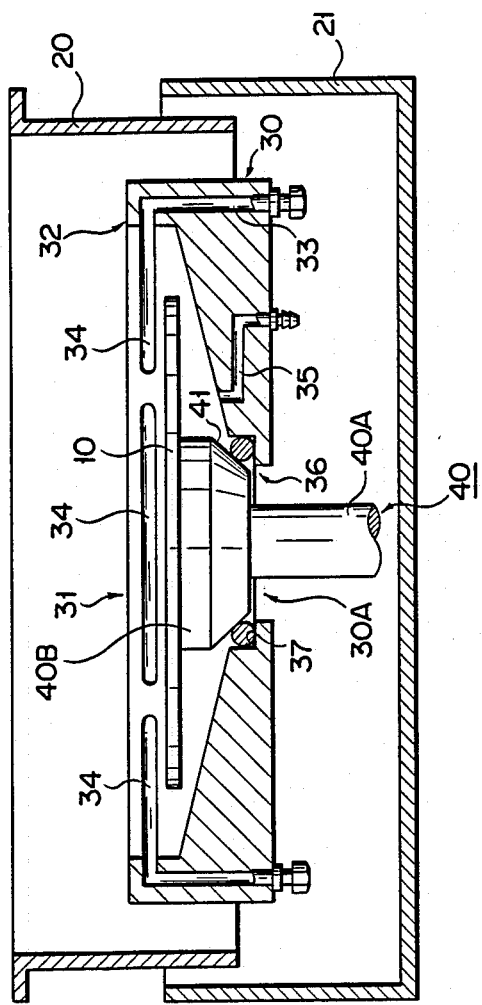
FIG. 2 is a schematic sectional view showing a developing apparatus according to an embodiment of the present invention.

FIG. 2 is a schematic sectional view showing an arrangement of a developing apparatus according the embodiment of the present invention. Reference numeral 20 denotes a cylindrical upper cup. Upper cup 20 is designed to prevent a developing solution from dispersing in a developing process. Cylindrical Lower cup 21 is arranged to be engaged with a lower end of upper cup 20. Upper and lower cups 20 and 21 can be independently moved in a vertical direction. Upper and lower cups 20 and 21 constitute an envelope.

Inner cup 30 constituting a cylindrical cup member is arranged in the envelope. Recess 31 is formed in an upper portion of inner cup 30 to define a dip tank of a developing solution. Opening 30A is formed at a central area of recess 31 to allow for a path enabling spin chuck 40 to move vertically.

Spin chuck 40 is an example of a wafer chuck. Spin chuck 40 comprises shaft 40A inserted into opening 30A, and chuck portion 40B is supported by an upper portion of shaft 40A and arranged in recess 31 such that it can be rotated. Chuck portion 40B is connected to a compressor or the like (not shown) and adapted to vacuum-chuck wafer 10 on which a resist film to be processed is formed.

A lower outer surface of disk-like spin chuck 40 is tapered portion 41. O-ring 37 to be described later is brought into contact with tapered portion 41 so as to seal a lower portion of recess 31 and form a dip tank.

An inner circumferential wall of recess 31 inclines downward toward a central portion of inner cup 30 to form a tapered surface. Step 36 is formed in the central portion of inner cup 30. O-ring 37, which serves as a seal member when the dip tank is formed, is arranged on step 36. Cleaning fluid supply pipe 35 for cleaning a lower surface of wafer 10 is arranged in inner cup 30 in such a manner that its spraying port is exposed inside recess 31. Inner cup 30 can be freely moved in the vertical direction.

For example, four developing solution supply pipes 32 (two pipes are shown in FIG. 2) are positioned in the outer end portion of inner cup 30 to extend from a bottom surface side of inner cup 30 to an upper surface side thereof. Upper portions of developing solution supply pipes 32 respectively communicate with four arcuate developing solution spraying ports 3 formed in the inner circumferential wall at equal angular intervals. The lower portions of the developing solution supply pipes are connected to a developing solution source (not shown).

Operation of the developing apparatus arranged in this manner will now be described with reference to FIGS. 3A to 3E.

(First step)

FIG. 3A shows a home position wherein upper, lower, and inner cups 20, 21, and 30 are located at their lowermost positions, respectively. Therefore, spin chuck 40 is located above upper cup 20. In this state, wafer 10 is conveyed by a transfer unit (not shown) and placed on spin chuck 40. Wafer 10 is then vacuum-chucked by spin chuck 10.

(Second step)

As shown in FIG. 3B, upper and lower cups 20 and 21 are moved upward. Then, wafer 10 is subjected to pre-wet processing, as needed. This processing promotes the developing effect of wafer 10.

(Third step)

Then, inner cup 30 is moved upward to a position shown in FIG. 3C so that wafer 10 is located inside inner cup 30. In this case, tapered portion 41 of spin chuck 40 is brought into contact with O-ring 37 arranged on the central portion of inner cup 30. As a result, a dip tank is formed among recess 31 of inner cup 30, tapered portion 41 of spin chuck 40, and O-ring 37.

In this case, as compared with a case wherein the positioning is performed using a flat surface, the dip tank is sealed by tapered portion 41 of spin chuck 40 and O-ring 37. For this reason, the dip tank can be reliably sealed without damage to the apparatus even if the predetermined movement of inner cup 30 varies.

(Fourth step)

Subsequently, a developing solution is supplied through four developing solution supply pipes 33 and uniformly sprayed from four arcuate developing solution spraying ports 34 formed in the inner circumferential wall of inner cup 30 at equal angular intervals. As shown in FIG. 3D, developing solution 11 is charged into the dip tank such that the entire surface of wafer 10 is dipped in developing solution 11, thereby executing the developing process. In this case, if developing solution 11 is supplied in the above-described manner, developing solution 11 is uniformly dispensed from a periphery of wafer 10. For this reason, the spraying pressure is not directly applied onto wafer 10. Therefore, even if a developing solution containing an activator (penetrating agent or surface protective agent) is used, the drawbacks of the conventional developing apparatus can be eliminated in the present invention.

In i.e., in the conventional developing apparatus the protective agent is precipitated on a wafer at a high pressure. As a result, the resist is caused to dissolve at a slow rate and sometimes no development occurs due to the frequent variation in the high spraying pressure. Further, in the developing apparatus of the present invention, developing solution 11 is uniformly dispensed and supplied to the entire surface of wafer 10, thereby causing further uniform development without any of the above mentioned drawbacks occurring. (Fifth step)

Upon completion of the developing process, lower and inner cups 21 and 30 are moved downward, as shown FIG. 3E. Then, O-ring 37 of inner cup 30 is separated from tapered surface 41 of spin chuck 40, and developing solution 11 is discharged through a gap between spin chuck 40 and inner cup 30, as shown in FIG. 3E. In this case, since the inner surface of recess 31 of inner cup 30 inclines downward toward the center to form the tapered portion, developing solution 11 can be reliably discharged by way of its own weight without being left in the inner surface of inner cup 30. Therefore, no special treatment for discharging the developing solution, e.g., using an extra suction unit, is required.

After the developing solution is discharged, wafer 10 is rinsed and its lower surface is cleaned in the manner shown in FIG. 3E. Wafer 10 is dried, and then upper cup 20 is moved downward to its original position shown in FIG. 3A. At this time, wafer 10, upon completion of the developing process, is conveyed by a transporting means to the next treatment process. Then, another wafer is conveyed by a transporting means into the inner cup 30 of the developing apparatus, and the same operation is repeatedly performed.

The present invention is not limited to the above embodiment, but various changes and modifications can be made within the sprit and scope of the invention. In the above embodiment, the developing solution supply pipes are arranged in inner cup 30 so that a developing solution can be sprayed along the periphery of wafer 10. However, the present invention is not limited to this arrangement. For example, the developing solution may be sprayed from the bottom surface side of wafer 10. With this arrangement, since the surface of the developing solution is uniformly moved upward upon supply of the developing solution, the spraying pressure is not directly applied to wafer 10, as in the embodiment, and the developing solution is therefore more uniformly applied to wafer 10. With this arrangement, further uniform development can be performed.

Figure 1:
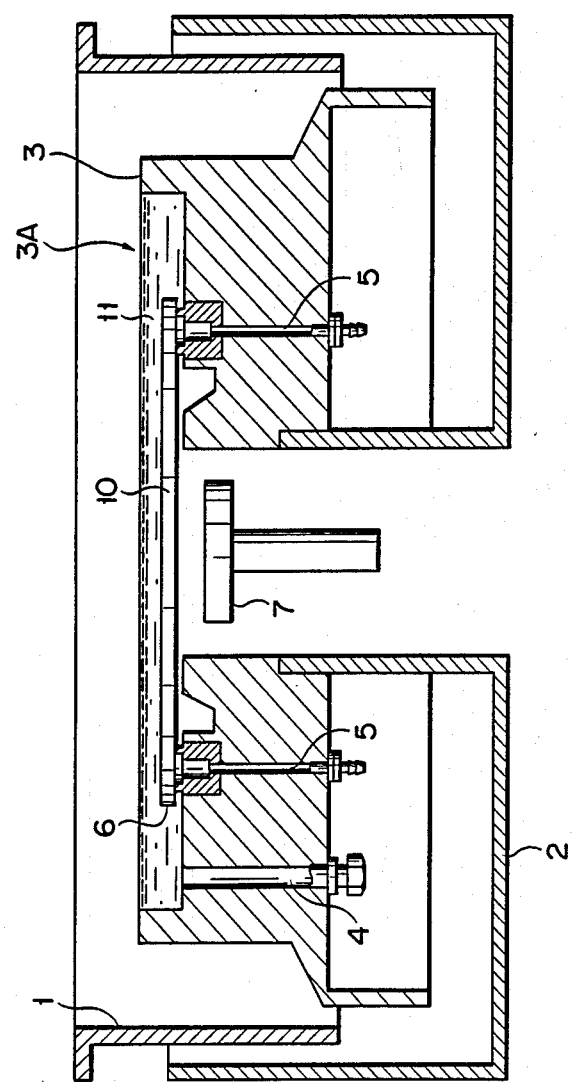
FIG. 1 is a sectional view showing an arrangement of a conventional developing apparatus.

Furthermore, the present invention does not limit the forming of the dip tank of a developing solution to a specific method, and hence is not limited to the particular embodiment described above. Therefore, as shown in FIG. 1, the inner cup may be brought into contact with the wafer to seal the dip tank.

What is claimed is:

1. A developing apparatus, comprising:
   a cup member forming a dip tank for a developing solution and within which an object to be developed is positioned;
   means for supplying the developing solution to said cup member so that said object can be dipped in the developing solution for performance of dip development, wherein said means for supplying developing solution comprises a supply path for supplying said developing solution into said cup member and which includes a developing solution supply pipe positioned in said cup member and at least one arcuate slit-like spraying port formed in an inner circumferential wall of said cup member and connected to said supply pipe such that said developing solution is uniformly dispersed from a periphery of said object.

2. An apparatus according to claim 1, wherein said at least one, arcuate slit-like spraying port comprises a plurality of spraying tubes formed in said inner circumferential wall of said cup member at predetermined angular intervals such that a uniform amount of developing solution is supplied toward a central portion of said cup member.

3. An apparatus according to claim 1, wherein said at least one arcuate, slit-like spraying port is formed so as to be exposed to a bottom portion of said cup member.

4. An apparatus according to claim 1, wherein said cup member comprises an inner cup and a lower cup wherein said inner cup is positioned within said lower cup.

5. An apparatus according to claim 1 wherein said spraying port of said at least one arcuate, slit-like supplying port is formed on a bottom side portion of said cup member with respect to said object located in said cup member.

6. An apparatus according to claim 1, wherein a portion of said dip tank is formed by a portion of said object.

7. An apparatus according to claim 1 wherein said object comprises a resist film deposited on a semiconductor wafer.

8. A developing apparatus comprising:
   a cup member forming a dip tank for a developing solution and within which an object to be developed is positioned;
   means for supplying the developing solution to said cup member so that said object can be dipped in the developing solution for performance of dip development, wherein said means for supplying developing solution comprises a supply path for supplying said developing solution into said cup member and which includes a developing solution supply pipe positioned in said cup member and at least one slit-like spraying port formed in an inner circumferential wall of said cup member and connected to said supply pipe such that said developing solution is uniformly dispersed from a periphery of said object.

* * * * *